(12) United States Patent
Morita et al.

(10) Patent No.: US 6,255,255 B1
(45) Date of Patent: Jul. 3, 2001

(54) OXIDE SUPERCONDUCTING MATERIAL AND METHOD OF PRODUCING THE SAME

(75) Inventors: Mitsuru Morita; Tetsuro Nose, both of Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/450,805

(22) Filed: Nov. 29, 1999

(30) Foreign Application Priority Data

Nov. 30, 1998 (JP) .................................................. 10-339867

(51) Int. Cl.⁷ ...................................................... C04B 1/00
(52) U.S. Cl. ........................... 505/100; 505/450; 505/451; 505/490; 252/521.1; 252/519.1; 252/519.15; 252/518.1
(58) Field of Search ..................... 505/126, 100, 505/450, 451, 490, 778, 779, 780, 781, 785; 252/521.1, 500, 519.1, 519.15, 518.1

(56) References Cited

U.S. PATENT DOCUMENTS

| | | | |
|---|---|---|---|
| 5,308,799 | * | 5/1994 | Morita et al. ........................ 505/126 |
| 5,508,253 | * | 4/1996 | Morita et al. ........................ 505/126 |
| 5,786,304 | * | 6/1998 | Kimura et al . ...................... 505/234 |
| 5,849,668 | * | 12/1998 | Yamaguchi et al. ................. 505/126 |
| 5,968,878 | * | 10/1999 | Kojo et al. ............................ 505/450 |

FOREIGN PATENT DOCUMENTS

| | | |
|---|---|---|
| 4-16511 | 1/1992 | (JP) . |
| 5-58626 | 3/1993 | (JP) . |
| 5-279033 | 10/1993 | (JP) . |
| 5-286719 | 11/1993 | (JP) . |
| 6-1609 | 1/1994 | (JP) . |

* cited by examiner

Primary Examiner—Yogendra Gupta
Assistant Examiner—Derrick G. Hamlin
(74) Attorney, Agent, or Firm—Kenyon & Kenyon

(57) ABSTRACT

An oxide superconducting material includes a $REBa_2Cu_3O_{7-x}$ phase (RE designating one or a combination of two or more rare earth elements including Y), particles composed of Ce, Ba, Cu and O dispersed therein, and $RE_2BaCuO_5$ or $RE_4Ba_2Cu_2O_{10}$ dispersed therein. A method is provided for producing the superconducting material from a mixed powder obtained by adding a Ce—Ba—Cu—O system additive to a starting material powder containing RE, Ba, Cu and O.

3 Claims, 1 Drawing Sheet

OXIDE SUPERCONDUCTING MATERIAL AND METHOD OF PRODUCING THE SAME

BACKGROUND OF THE INVENTION

1. Field of the Invention

The present invention relates to an approximately 90K-class (critical temperature Tc=approx. 90 degrees Kelvin) oxide superconducting material and a method of producing the same.

2. Description of the Related Art

The conventional method of raising the critical current density (Jc) of oxide superconducting materials is to establish pinning sites in $REBa_2Cu_3O_{7-x}$ (superconducting phase; abbreviated: 123 phase) by dispersion of about 1-micron particles of $RE_2BaCuO_5$ (211) or $RE_4Ba_2Cu_2O_{10}$ (422). (RE in the foregoing notations designates one or a combination of two or more rare earth elements including Y.) It is known that 211 can be refined to around 1 micron by addition of Pt or Rh and that 422 can be refined to about the same level by addition of Ce. It is also known that a portion of the added Ce forms fine $CeBaO_3$ of a particle size of 1 micron or less that disperses into the superconducting phase.

JP-A-(unexamined published Japanese patent application)4-16511 teaches a structure having $BaMO_3$ (M representing Zr, Sn, Ce or Ti) finely dispersed together with 211 in stacked plate-like 123 phase. Materials having this structure are produced in a temperature gradient. JPA-5-279033, JP-A-5-286719, JP-A-6-1609 teach methods of producing superconductors in which 211 is finely dispersed by adding cerium oxide. They also teach structures having cerium oxide finely dispersed in 123 phase together with 211 and a noble metal such as silver. JP-A-5-58626 describes a superconductor having 211 finely dispersed in 123 phase containing Ce and method of producing the superconductor and teaches that addition of Ce enables fine dispersion of 211 by suppressing its agglomeration and enlargement.

From the viewpoint of achieving high Jc, it is preferable to introduce a large amount of fine non-superconducting particles and other pinning centers in the 123 phase. While 211 and 422 are currently the main non-superconducting phases used to produce pinning sites, the $CeBaO_3$, SnBaO etc. taught in the foregoing literature also contribute to the pinning site formation, although at a lower rate than 211. The development of still other new substances capable of forming pinning sites is a challenge that demands attention.

SUMMARY OF THE INVENTION

That $CeBaO_3$, a Ce—Ba—O system compound, is capable of forming pinning sites was thus known in the prior art. Now, the present inventors have discovered that particles composed of Ce, Ba, Cu and O (hereinafter called Ce—Ba—Cu—O system particles) constitute a new class of pinning site forming materials. They also discovered that when the particles are given a composition of $Ce_xBa_yCu_zO_w$, their effect is enhanced in the composition range of $2.4 \leq x \leq 3.6$, $2.4 \leq y \leq 3.6$, $0.8 \leq z \leq 1.2$, $8 \leq w \leq 12$. They further discovered that when the particle composition includes $Ce_3Ba_3CuO_{10}$, the particles particularly enhance Jc by dispersing into the superconducting phase as submicron-diameter particles to become still more effective pinning sites. They additionally found that the Ce—Ba—Cu—O system particles coexist with 211 and 422 in the 123 phase.

When the $Ce_xBa_yCu_zO_w$ content is too large, critical temperature and Jc decrease rather than increase because a portion of the Ce disperses in the 123 phase. The content is therefore preferably 15 mass % or less, more preferably 1–10 mass %.

The inventors also discovered that the Ce—Ba—Cu—O system particles can coexist with 211, 422 and 123 phases containing Pt, Rh or Ag. When the Pt content is less than 0.05 mass %, 211 is not refined, and when it is greater than 2.0 mass %, the addition efficacy decreases because the excess Pt forms many extraneous phases. The Pt content is therefore preferably 0.05–2.0 mass %, more preferably 0.3–0.6 mass %. When the Rh content is less than 0.01 mass %, 211 is not refined, and when it is greater than 1.0 mass %, the addition efficacy decreases because the excess Rh forms many extraneous phases. The Rh content is therefore preferably 0.01–1.0 mass %, more preferably 0.1–0.3 mass %. When Ag is added, about 0.1 mm-diameter Ag particles precipitate into the 123 phase to enhance the mechanical strength. When the amount of Ag added is less than 5 mass %, Ag particles do not precipitate, and when it is greater than 20 mass %, a tendency to inhibit crystal growth of the 123 phase arises. The amount of Ag addition is therefore limited to 5–20 mass %, more preferably 10–15 mass %.

The inventors discovered a method of producing a material containing effectively dispersed $Ce_xBa_yCu_zO_w$ by mixing $Ce_xBa_yCu_zO_w$ with a starting material powder containing RE (RE designating one or a combination of two or more rare earth elements including Y), Ba, Cu and O. When a powder compact formed by compacting the mixed powder is placed in an oxidizing atmosphere in the temperature range of 850–1,250° C., it assumes a semi-molten state in which 211 or 442 coexists with a liquid phase. When the compact is heat-treated in the atmosphere, it assumes a semi-molten state at 850–1,250° C. The 123 phase grows while incorporating $Ce_xBa_yCu_zO_w$ to provide a 123 phase containing pinning sites of $Ce_xBa_yCu_zO_w$ and 211 or 422 by carrying out slow cooling from the above described semi-molten state to a temperature range at which a 123 phase grows as a crystal, or slow cooling or maintaining an isothermal temperature in a temperature range for growing a 123 phase to crystallize.

Preferably, slow cooling or maintaining an isothermal temperature is carried out from a starting temperature for growing a 123 phase crystallization (Tp: peritectic temperature) to Tp-30° C. This method can provide a material containing effectively dispersed $Ce_xBa_yCu_{O_w}$ because the $Ce_xBa_yCu_zO_w$ remains in the material without decomposing during processing.

A material containing dispersed $Ce_3Ba_3CuO_{10}$ can be obtained by adding $Ce_3Ba_3CuO_{10}$ to a starting material powder containing RE, BA, Cu and O.

DESCRIPTION OF THE PREFERRED EMBODIMENTS

Figure 1:
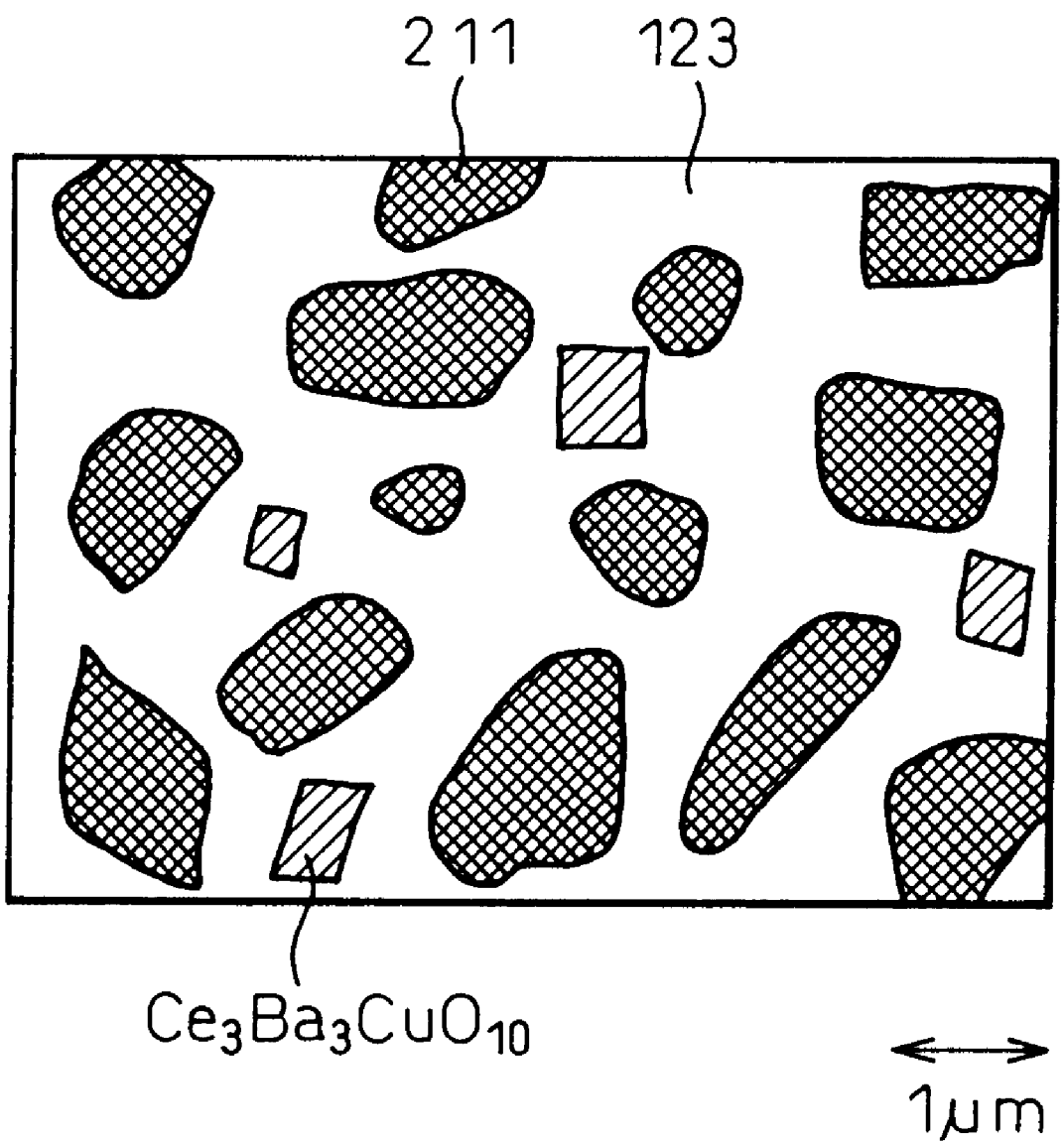
FIG. 1 is a diagram schematically illustrating the structure of an oxide superconducting material wherein both $Ce_3Ba_3CuO_{10}$ particles and 211 are dispersed.

The present invention will now be explained in further detail with reference specific examples.

EXAMPLE 1

$Y_2O_3$, $BaO_2$ and CuO starting material powders were mixed at a mole ratio of the metallic elements (Y:Ba:Cu) of (13:17:24). The mixed powders were added with 2.0 mass % of $Ce_3Ba_3CuO_{10}$ powder and 0.3 mass % of Pt and the result was mixed to prepare a mixed starting material powder. The starting material powder was calcined in a stream of oxygen at 900° C. The calcined powder was formed into a disk-shaped compact measuring 30mm in diameter and 20mm in thickness by compression at 196 MPa using a rubber press.

The compact was heated to 1,150° C. in the atmosphere over 8 hours and thereafter held at this temperature for 1 hour. Then, at a temperature of 1,040° C., a Nd-system seed crystal was placed with its c-axis substantially aligned with a line normal to the disk surface. Next, crystal growth was effected by first lowering the temperature to 1,005° C. over 30 minutes and then conducting gradual cooling to 980° C. over 120 hours. This was followed by cooling to room temperature over 24 hours. An approximately 15 mm-thick bulk was obtained from the resulting cylindrical bulk material by slicing off the opposite end faces and removing the surface layer. The result was subjected to oxygen enrichment by heating the bulk to 500° C. in a stream of oxygen over 24 hours, gradually cooling it from 500° C. to 350° C. over 100 hours and then cooling it from 350° C. to normal room temperature over 10 hours.

A single crystal having the same crystal orientation as the seed crystal was obtained. The c-axis of the single crystal substantially coincided with a line normal to the disk surface. The critical current density was measured using a sample vibrating type flux meter and found to be $3.5 \times 10^4$ (A/cm$^2$) at 77K, 1 T (c-axis and magnetic field parallel). By observation with a transmission electron microscope, the structure was found to consist of 0.2–1.0 micron-diameter particles dispersed together with 211 in a 123 phase. The structure is shown schematically in FIG. 1. The particles were ascertained to be $Ce_3Ba_3CuO_{10}$ by energy dispersive spectroscopy (EDS).

As a comparative example, a cylindrical bulk material was prepared in the same manner as described above except that no $Ce_3Ba_3CuO_{10}$ was added. The crystal obtained had a critical current density of $2.8 \times 10^4$ (A/cm$^2$) at 77K, 1T (c-axis and magnetic field parallel).

The material according to the invention was thus clearly superior to that of the comparative example.

EXAMPLE 2

$Dy_2O_3$, $BaO_2$ and CuO starting material powders were mixed at a mole ratio of the metallic elements (Dy:Ba:Cu) of (13:17:24) to prepare a mixed starting material powder. $CeO_2$, $BaO_2$ and CuO powders were mixed at a mole ratio of the metallic elements (Ce:Ba:Cu) of (3:2:1) and the mixed powders were calcined in oxygen at 900° C. for 8 hours to prepare a Ce—Ba—Cu—O system additive. The mixed starting material powder was added with 2.0 mass % of the Ce—Ba—Cu—O system additive and 0.3 mass % of Pt and the result was mixed to prepare a starting material powder. The starting material powder was calcined in a stream of oxygen at 900° C. The calcined powder was formed into a disk-shaped compact measuring 30 mm in diameter and 20 mm in thickness by compression at 196 MPa using a rubber press.

The compact was heated to 1,150° C. in the atmosphere over 8 hours and thereafter held at this temperature for 1 hour. Then, at a temperature of 1,040° C., a Nd-system seed crystal was placed with its c-axis substantially aligned with a line normal to the disk surface. Next, crystal growth was effected by first lowering the temperature to 1,010° C. over 30 minutes and then conducting gradual cooling to 985° C. over 100 hours. This was followed by cooling to room temperature over 24 hours. An approximately 15 mm-thick bulk was obtained from the resulting cylindrical bulk material by slicing off the opposite end faces and removing the surface layer. The result was subjected to oxygen enrichment by heating the bulk to 500° C. in a stream of oxygen over 24 hours, gradually cooling it from 500° C. to 350° C. over 100 hours and then cooling it from 350° C. to normal room temperature over 10 hours.

A single crystal having the same crystal orientation as the seed crystal was obtained. The c-axis of the single crystal substantially coincided with a line normal to the disk surface. The critical current density was measured using a sample vibrating type flux meter and found to be $3.1 \times 10^4$ (A/cm$^2$) at 77K, 1 T (c-axis and magnetic field parallel). By observation with a transmission electron microscope, the structure was found to consist of 0.2–1.0 micron-diameter Ce—Ba—Cu—O system particles dispersed together with 211.

As a comparative example, a cylindrical bulk material was prepared in the same manner as described above except that no Ce—Ba—Cu—O system additive was added. The crystal obtained had a critical current density of $2.7 \times 10^4$ (A/cm$^2$) at 77K, 1T (c-axis and magnetic field parallel).

The material according to the invention having a structure including dispersed Ce—Ba—Cu—O system particles was thus clearly superior to that of the comparative example.

EXAMPLE 3

$Er_2O_3$, $BaO_2$ and CuO starting material powders were mixed at a mole ratio of the metallic elements (Er:Ba:Cu) of (13:17:24) to prepare a mixed starting material powder. $CeO_2$, $BaO_2$ and CuO powders were mixed at a mole ratio of the metallic elements (Ce:Ba:Cu) of (1:1:1) and the mixed powders were calcined in oxygen at 920° C. for 8 hours to prepare a Ce—Ba—Cu—O system additive. The mixed starting material powder was added with 2.0 mass % of the Ce—Ba—Cu—O system additive and 0.3 mass % of Pt and the result was mixed to prepare a starting material powder. The starting material powder was calcined in a stream of oxygen at 900° C. The calcined powder was formed into a disk-shaped compact measuring 30 mm in diameter and 20 mm in thickness by compression at 196 MPa using a rubber press.

The compact was heated to 1,150° C. in the atmosphere over 8 hours and thereafter held at this temperature for 1 hour. Then, at a temperature of 1,040° C., a Nd-system seed crystal was placed with its c-axis substantially aligned with a line normal to the disk surface. Next, crystal growth was effected by first lowering the temperature to 995° C. over 30 minutes and then conducting gradual cooling to 975° C. over 130 hours. This was followed by cooling to room temperature over 24 hours. An approximately 15 mm thick bulk was obtained from the resulting cylindrical bulk material by slicing off the opposite end faces and removing the surface layer. The result was subjected to oxygen enrichment by heating the bulk to 500° C. in a stream of oxygen over 24 hours, gradually cooling it from 500° C. to 350° C. over 100 hours and then cooling it from 350° C. to normal room temperature over 10 hours.

A single crystal having the same crystal orientation as the seed crystal was obtained. The c-axis of the single crystal substantially coincided with a line normal to the disk surface. The critical current density was measured using a sample vibrating type flux meter and found to be $3.1 \times 10^4$ (A/cm$^2$) at 77K, 1 T (c-axis and magnetic field parallel). By observation with a transmission electron microscope, the structure was found to consist of 0.2–1.0 micron-diameter Ce—Ba—Cu—O system particles dispersed together with 211.

As a comparative example, a cylindrical bulk material was prepared in the same manner as described above except that no Ce—Ba—Cu—O system additive was added. The crystal obtained had a critical current density of $2.7 \times 10^4$ (A/cm$^2$) at 77K, 1 T (c-axis and magnetic field parallel).

The material according to the invention having a structure including dispersed Ce—Ba—Cu—O system particles was thus clearly superior to that of the comparative example.

EXAMPLE 4

$Nd_2O_3$, $BaO_2$ and CuO starting material powders were mixed at a mole ratio of the metallic elements (Nd:Ba:Cu) of (12:16:23). The mixed powders were added with 4.0 mass % of $Ce_3Ba_3CuO_{10}$ powder and 10 mass % of Ag and the result was mixed to prepare a mixed starting material powder. The starting material powder was calcined in a stream of oxygen at 900° C. The calcined powder was formed into a disk-shaped compact measuring 30 mm in diameter and 20 mm in thickness by compression at 196 MPa using a rubber press.

The compact was heated to 1,150° C. in argon containing 0.01 mol % of oxygen over 8 hours and thereafter held at this temperature for 0.5 hour. Then, at a temperature of 1,040° C., a Nd-system seed crystal was placed with its c-axis substantially aligned with a line normal to the disk surface. Next, crystal growth was effected by first lowering the temperature to 1,010° C. over 30 minutes and then conducting gradual cooling to 970° C. over 100 hours. This was followed by cooling to room temperature over 24 hours. An approximately 15 mm-thick bulk was obtained from the resulting cylindrical bulk material by slicing off the opposite end faces and removing the surface layer. The result was subjected to oxygen enrichment by heating the bulk to 400° C. in a stream of oxygen over 24 hours, gradually cooling it from 400° C. to 250° C. over 100 hours and then cooling it from 250° C. to normal room temperature over 10 hours.

A single crystal having the same crystal orientation as the seed crystal was obtained. The c-axis of the single crystal substantially coincided with a line normal to the disk surface. The critical current density was measured and found to be $3.5 \times 10^4$(A/cm$^2$) at 77K, 1 T (c-axis and magnetic field parallel). By observation with a transmission electron microscope, the structure was found to consist of 0.2–1.0 micron-diameter Ce—Ba—Cu—O system particles finely dispersed together with 422. The particles were ascertained to be $Ce_3Ba_3CuO_{10}$ by EDS.

The superiority of the material according to the invention was thus ascertained.

The oxide superconducting material according to the present invention excels in Jc property and can be expected to make a considerable contribution to industry through application to magnetic levitation systems and magnets.

What is claimed is:

1. An oxide superconducting material comprising a $REBa_2Cu_3O_{7-x}$ phase, particles composed of Ce, Ba, Cu and O dispersed therein, and $RE_2BaCuO_5$ or $RE_4Ba_2Cu_2O_{10}$ dispersed therein, wherein the particles composed of Ce, Ba, Cu and O have a composition of $Ce_xBa_yCu_zO_w$, where $2.4 \leq x \leq 3.6$, $2.4 \leq y \leq 3.6$, $0.8 \leq z \leq 1.2$ and $8 \leq w \leq 12$.

2. An oxide superconducting material according to claim 1, wherein the $Ce_xBa_yCu_zO_w$ includes at least $Ce_3Ba_3CuO_{10}$.

3. An oxide superconducting material according to any of claims 1, and 2, further comprising 0.05–2.0 mass % of Pt, 0.01–1.0 mass % of Rh, or 5–20 mass % of Ag.

* * * * *